US012581829B2

(12) United States Patent
Yu et al.

(10) Patent No.: US 12,581,829 B2
(45) Date of Patent: Mar. 17, 2026

(54) DISPLAY DEVICE

(71) Applicant: SAMSUNG DISPLAY CO., LTD.,
Yongin-si (KR)

(72) Inventors: Hyeyoung Yu, Yongin-si (KR);
Seon-Kyong Kim, Yongin-si (KR);
Yunoh Nam, Yongin-si (KR);
Kang-Yong Lee, Yongin-si (KR);
Younhwan Jung, Yongin-si (KR)

(73) Assignee: SAMSUNG DISPLAY CO., LTD.,
Yongin-si (KR)

( * ) Notice: Subject to any disclaimer, the term of this
patent is extended or adjusted under 35
U.S.C. 154(b) by 0 days.

(21) Appl. No.: 18/804,463

(22) Filed: Aug. 14, 2024

(65) Prior Publication Data

US 2025/0169325 A1 May 22, 2025

(51) Int. Cl.
| | |
|---|---|
| *H10K 59/40* | (2023.01) |
| *H05K 1/18* | (2006.01) |
| *H05K 1/189* | (2026.01) |
| *H10K 59/131* | (2023.01) |
| *H10K 59/80* | (2023.01) |

(52) U.S. Cl.
CPC ............. *H10K 59/40* (2023.02); *H05K 1/189*
(2013.01); *H10K 59/131* (2023.02); *H10K*
*59/8722* (2023.02); *H05K 2201/10128*
(2013.01)

(58) Field of Classification Search
CPC .. H10K 59/8722; H10K 59/131; H10K 59/40;
H05K 1/147; H05K 1/189; H05K
2201/10128
See application file for complete search history.

(56) References Cited

U.S. PATENT DOCUMENTS

| | | | | |
|---|---|---|---|---|
| 10,418,389 B2 * | 9/2019 | Lee | ...................... | H10K 77/111 |
| 10,820,417 B2 * | 10/2020 | Park | ...................... | H05K 1/189 |
| 10,897,021 B2 * | 1/2021 | Jung | ................... | H10K 59/131 |
| 10,936,111 B2 * | 3/2021 | Kim | ...................... | G06F 3/0416 |
| 10,966,315 B2 * | 3/2021 | Uogishi | ................. | H05K 1/028 |
| 11,301,071 B2 * | 4/2022 | Jeon | ...................... | H10K 59/131 |
| 11,693,499 B2 * | 7/2023 | Eom | ...................... | G06F 3/0412 |
| | | | | 345/173 |
| 11,706,872 B2 * | 7/2023 | Shi | ...................... | H05K 1/0203 |
| | | | | 361/749 |
| 12,010,798 B2 * | 6/2024 | Shi | ........................ | G09F 9/301 |
| 12,058,830 B2 * | 8/2024 | Cho | ................... | H04M 1/0214 |
| 12,295,103 B2 * | 5/2025 | Shin | ................... | H04M 1/0277 |
| 12,342,462 B2 * | 6/2025 | Ryu | ...................... | H05K 1/147 |
| 12,356,549 B2 * | 7/2025 | Zhang | ................... | H05K 1/147 |

(Continued)

FOREIGN PATENT DOCUMENTS

| | | |
|---|---|---|
| KR | 10-0615248 B1 | 8/2006 |
| KR | 10-2015-0043801 A | 4/2015 |
| KR | 10-2021-0020526 A | 2/2021 |

*Primary Examiner* — Vinh T Lam
(74) *Attorney, Agent, or Firm* — F. CHAU &
ASSOCIATES, LLC

(57) ABSTRACT

A display device includes a display panel including a pad
area, a flexible printed circuit board connected to the display
panel, and a buffer layer disposed between the display panel
and the flexible printed circuit board. The flexible printed
circuit board includes a body part on which components are
arranged, a pressing part disposed along an edge of the body
part and bonded to the pad area, and a tail part extending
from the body part, and the tail part overlaps the buffer layer.

20 Claims, 12 Drawing Sheets

(56) References Cited

U.S. PATENT DOCUMENTS

| 2017/0338294 | A1* | 11/2017 | Choi | H10K 77/111 |
| 2020/0020754 | A1* | 1/2020 | Kim | H10K 77/111 |
| 2020/0077508 | A1* | 3/2020 | Uogishi | H05K 3/28 |
| 2021/0104695 | A1* | 4/2021 | Jung | H10K 77/111 |
| 2022/0109041 | A1* | 4/2022 | Lee | H10K 59/8731 |
| 2023/0352497 | A1* | 11/2023 | Chen | G09G 3/32 |
| 2024/0147787 | A1* | 5/2024 | Li | H10D 89/60 |
| 2024/0381525 | A1* | 11/2024 | Kum | H05K 1/028 |

* cited by examiner

300 : 310, 320, 330, 340
330 : 331, 332

PA : DPA, TPA1, TPA2

300 : 310, 320, 330, 340
330 : 331, 332

PS : CSL, SPL, SDL

300 : 310, 320, 330, 340
330 : 331, 332

DR2

DR3

DISPLAY DEVICE

CROSS-REFERENCE TO RELATED APPLICATION

This application claims priority to and the benefit of Korean Patent Application No. 10-2023-0159084 filed at the Korean Intellectual Property Office on Nov. 16, 2023, the entire contents of which are herein incorporated by reference.

BACKGROUND

(a) Technical Field

This disclosure relates to a display device, and more specifically, to a display device including a display panel that displays images and a flexible printed circuit board connected thereto.

(b) Description of the Related Art

A display device includes pixels and displays images on a display screen by controlling the brightness of each pixel. The display device may include a touch sensing unit capable of detecting a user's touch. A display device may include a display panel on which pixels are formed. The touch sensor may be provided on the display panel. For example, the display panel may include a touch sensor, or a panel including a touch sensor may be attached to the display panel.

SUMMARY

The display device may include a flexible circuit board that is connected to the display panel and transmits signals to the display panel. For example, the display panel may receive signals for driving pixels and signals for driving a touch sensor through a flexible printed circuit board.

In an electronic device to which the display device are applied, the flexible printed circuit board may be bent to prevent interference with other components (e.g., batteries). The bent portion of the flexible circuit board increases in thickness so that it may press the adhesive layer that attaches the display panel and the cover window, and the pressed portion of the adhesive layer may be visible through the cover window.

Embodiments provides a display device that may relieve pressure on an adhesive layer by a bent portion of a flexible printed circuit board.

A display device according to an embodiment includes a display panel including a pad area, a flexible printed circuit board connected to the display panel, and a buffer layer disposed between the display panel and the flexible printed circuit board. The flexible printed circuit board includes a body part on which components are arranged, a connection part disposed along a first edge of the body part and bonded to the pad area, and a tail part extending from a second edge, opposite to the first edge, the body part, and the tail part vertically overlaps the buffer layer.

The tail part may include a bent portion, and the bent portion may vertically overlap the buffer layer.

The connection part may extend in a first direction parallel to a shorter side of the display panel, and the tail part may include a first portion extending from the second edge of the body part in a second direction parallel to a longer side of the display panel and intersecting the first direction and a second portion extending from the first portion in the first direction. The first portion may be bent about an axis parallel to the first direction.

At least a portion of the second portion may overlap the body part.

A width of the buffer layer may be equal to or greater than a width of the tail part.

The buffer layer may be made of stainless steel.

The buffer layer may be attached to a back of the display panel.

The buffer layer may be attached to the tail part.

The buffer layer may be attached to the tail part using an adhesive layer. The adhesive layer may be disposed between a portion of the buffer layer and the tail part. The portion of the buffer layer may be attached to the tail part using the adhesive layer. The portion of the buffer layer may correspond to two thirds or less of a planar area of the buffer layer.

The display device may further include a cover window overlapping the display panel, and an adhesive layer disposed between the display panel and the cover window.

A display device according to an embodiment includes a display panel including a main area including a display area and a touch area, a sub-area extending from the main area and where a display driver is located, wherein the main area has a first side extending in a first direction and a second side extending in a second direction, wherein the second side is longer than the first side, and the first direction intersects the second direction, a flexible printed circuit board connected to the sub-area, and a buffer layer disposed between the main area and the flexible printed circuit board. The flexible printed circuit board includes a body part where the touch driver is located, a connection part disposed along a first edge of the body part and bonded to the sub-area, and a tail part extending from a second edge, opposite to the first edge, of the body part and having a thickness thinner than the body part. The tail part includes a first portion extending from the body part and overlapping the buffer layer, and a second portion extending from the first portion.

The first portion may include a bent portion, and the bent portion may overlap the buffer layer.

The second portion may extend in the first direction, and the first portion may extend in the second direction and may be bent about an axis parallel to the first direction.

At least a portion of the second portion may vertically overlap the body part.

A width of the buffer layer may be greater than a width of the first portion.

The buffer layer may have a thickness of about 0.2 mm or less.

The buffer layer may be attached to a back of the main area.

The buffer layer may be attached to the first portion.

The display device may further include an adhesive layer disposed between a portion of the buffer layer and the tail part. The buffer layer may be attached to the first portion. The portion of the buffer layer may be attached to tail part using the adhesive layer. The portion of the buffer layer may correspond to two thirds or less of a planar area of the buffer layer.

The display device may further include a cover window overlapping the display panel, and an adhesive layer disposed between the display panel and the cover window.

According to embodiments, it is possible to provide a display device that may relieve pressure on the adhesive layer by the bent portion of the flexible circuit board and prevent the pressed portion of the adhesive layer from being recognized. Additionally, according to the embodiments, there are advantageous effects that can be recognized throughout the specification.

DETAILED DESCRIPTION OF THE EMBODIMENTS

Figure 1:
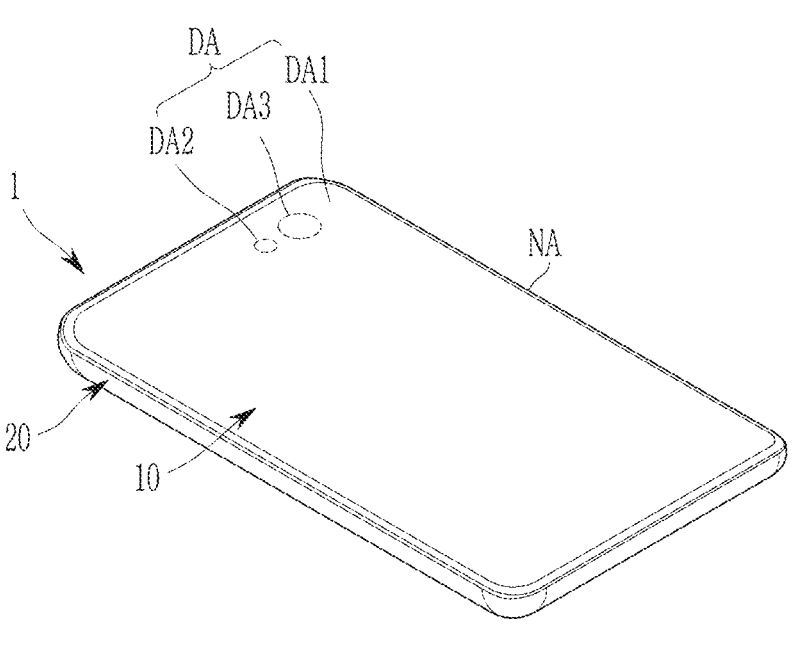
FIG. 1 is a perspective view of an electronic device according to an embodiment of the present disclosure.

With reference to the attached drawings, the embodiments will be described in detail so that those skilled in the art can easily implement the embodiments.

When a part of a layer, membrane, region, or plate is said to be "above" or "on" another part, this includes not only being "directly on" another component, but also having another component in between. Conversely, when a composition is said to be "right above" another composition, it means that there is no other composition in between.

Throughout the specification, a part may further include other elements, unless there is a statement to the contrary that it "includes" a certain element.

Throughout the specification, "connected" does not only mean when two or more components are directly connected, but also when two or more components are indirectly connected through other components, when they are physically connected, or when they are electrically connected, in addition to these cases, it may include cases where each part, which is referred to by a different name depending on location or function but is substantially integrated, is connected to another.

In the drawings, the symbols "DR1", "DR2", and "DR3" are used to indicate directions, where "DR1" is a first direction, "DR2" is a second direction perpendicular to the first direction, and "DR3" is a third direction perpendicular to the first and second directions.

Figure 2:
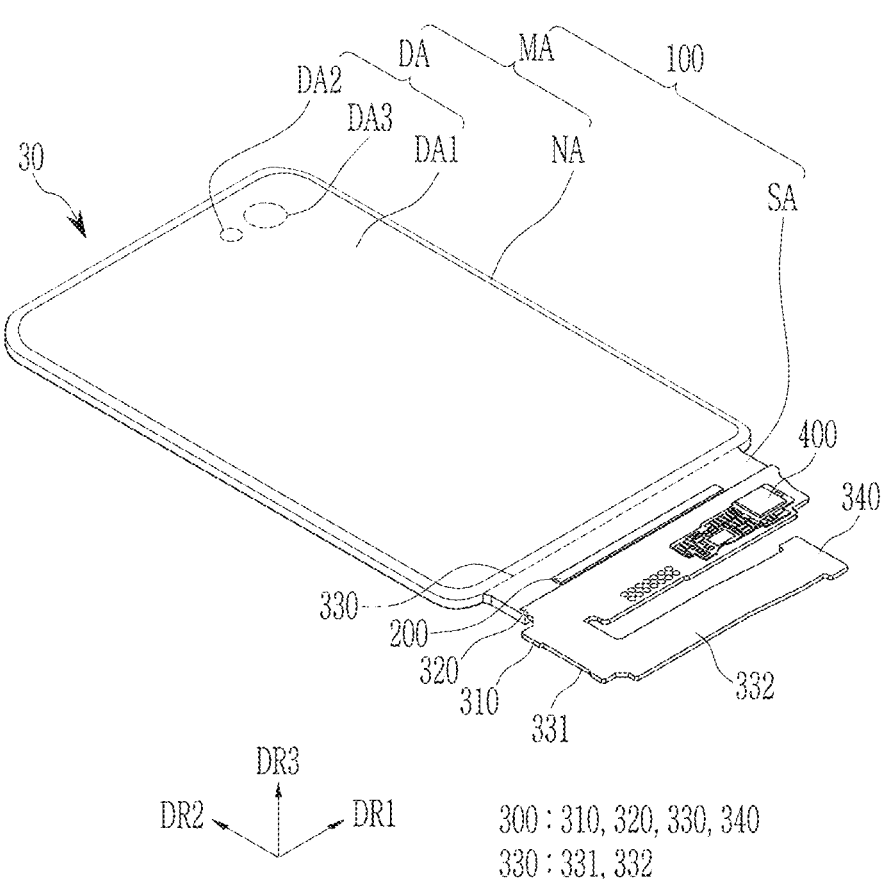
FIG. 2 is a perspective view of a display device included in an electronic device according to an embodiment of the present disclosure.

FIG. 1 is a schematic perspective view of an electronic device according to an embodiment, and FIG. 2 is a perspective view of a display device included in the electronic device according to an embodiment.

Referring to FIGS. 1 and 2, the electronic device 1 may include a display screen that can display images in a third direction DR3. The display screen may correspond to the front of the electronic device 1 in a plane defined by the first direction DR1 and the second direction DR2. The electronic device 1 may be a device whose main function is to display images. The electronic device 1 may be a smartphone, a mobile phone, a tablet, a multimedia player, a game console, or a monitor. The electronic device 1 may include a cover window 10, a housing 20, or a display device 30.

The cover window 10 may include an insulating panel. For example, the cover window 10 may be made of glass, plastic, or a combination thereof. The front of the cover window 10 may define the front of the electronic device 1. An area of the cover window 10 corresponding to the display screen may be optically transparent. The cover window 10 is located above the display device 30 to protect the display device 30 from external shocks and the like, and to transmit images displayed by the display device 30. The cover window 10 may also be considered as a component of the display device 30.

The housing 20 may be made of a material with relatively high rigidity. For example, the housing 20 may include a plurality of frames and/or plates made of glass, plastic, metal, or a combination thereof. The housing 20 may be combined with the cover window 10. The combined structure of the combined housing 20 and cover window 10 may constitute the appearance of the electronic device 1 and provide an internal space for the electronic device 1. For example, the housing 20 may form the back and sides of the electronic device 1, and the cover window 10 may form the front of the electronic device 1. The display device 30 may be located in the internal space defined by the cover window 10 and the housing 20 which protect the display device 30 from the external environment.

The display device 30 can display images and provide a display screen of the electronic device 1. The display device 30 may be a light-emitting display device, such as an organic light-emitting display device, an inorganic light-emitting display device, and a quantum dot light-emitting display device.

The electronic device 1 may have various shapes. For example, the electronic device 1 may have a rectangular shape with rounded corners when viewed from the front, as shown in FIG. 1. In an embodiment, the electronic device 1 may have a shape such as a rectangle, a square, a polygon, a circle, and an oval.

Each of the electronic device 1 and the display device 30 may include a display area DA and a non-display area NA. The display area DA and the non-display area NA of the electronic device 1 as shown in FIG. 1 may correspond to the display area DA and the non-display area NA of the display device 30 as shown in FIG. 2. The display area DA is an area where an image is displayed and may correspond to a display screen. The non-display area NA is an area where images are not displayed. For example, the front of the electronic device 1 may be divided into the display area DA and the non-display area NA.

The display area DA may occupy most of the front of the electronic device 1, and the non-display area NA may surround the display area DA. In an embodiment, the non-display area NA may entirely or partially surround the display area DA. The display area DA may include a first display area DA1, a second display area DA2, and a third display area DA3. The second display area DA2 and the third display area DA3 may be areas where components such as sensors and cameras for adding various functions to the electronic device 1 are placed on the rear side. The second display area DA2 and the third display area DA3 may correspond to a component area. The second display area DA2 and the third display area DA3 may be surrounded by the first display area DA1. In addition to the first display area DA1, the second display area DA2 and the third display area DA3 can display images. The positions and numbers of the second display area DA2 and third display area DA3 may be changed in various ways. The first direction DR1 is parallel to a shorter side of the first display area DA1, and the second direction DR2 is parallel to a longer side of the first display area DA1.

To describe the display device 30 in more detail, the display device 30 may provide a display screen in the electronic device 1. A planar shape of the display device 30 may resemble a planar shape of the electronic device 1.

The display device 30 may include a display panel 100, a display driver 200, a flexible printed circuit board 300, and a touch driver 400. The display panel 100 may be attached to the cover window 10 by an adhesive layer. The display panel 100 may include a main area MA and a sub-area SA.

The main area MA may include a display area DA where pixels that display images are arranged, and a non-display area NA around the display area DA. The display area DA may include a first display area DA1, a second display area DA2, and a third display area DA3. Components such as sensors and cameras may be placed on the back of the second and third display areas DA2 and DA3, and the second display area DA2 and third display area DA3 correspond to the component area. The display area DA may emit light in the third direction DR3 from light-emitting areas corresponding to light-emitting elements. For example, the display panel 100 may include a pixel circuit portion including transistors, signal lines (e.g., gate lines, data lines, and voltage lines) connected to the pixel circuit portion, and a light-emitting element connected to the pixel circuit portion.

The display panel 100 may include a pixel definition layer having an opening that defines a light-emitting area of each light-emitting element. The light-emitting element may include an organic light-emitting diode including an organic light-emitting layer, a quantum dot light-emitting diode including a quantum dot light-emitting layer, an inorganic light-emitting diode including an inorganic semiconductor, and/or a micro light-emitting diode. The non-display area NA may surround the display area DA.

The non-display area NA may be defined as an edge area of the main area MA of the display panel 100. Circuits and/or signal lines for generating and/or transmitting various signals applied to the display area DA may be disposed in the non-display area NA. For example, the non-display area NA may include a gate driver (not shown) that supplies gate signals to the gate lines, and fan-out lines connecting the display driver 200 to signal lines in the display area DA (not shown).

The sub-area SA may be an area extending from one side of the main area MA in a direction away from the main area MA. The sub-area SA may include a flexible area capable of bending, folding, rolling, etc. For example, the sub-area SA may be bent to overlap the main area MA in the thickness direction (third direction DR3). The display driver 200 may be located in the sub-area SA, and a pad area of the display panel 100 may be located at an edge of the sub-area SA. In an embodiment, the pad area of the display panel 100 may be adjacent to the edge of the sub-area SA. The configuration of the pad area will be described in detail with reference to FIG. 3. A flexible printed circuit board 300 may be connected to the pad area of the display panel 100. In an embodiment, the sub-area SA may be omitted, and the display driver 200 and the pad area may be placed in the non-display area NA.

The display driver 200 may output signals and voltages for driving the display panel 100. The display driver 200 may supply data voltages to data lines. The display driver 200 may supply power voltages to power lines and gate control signals to the gate driver. The display driver 200 may be provided as an integrated circuit chip and may be mounted on the display panel 100. For example, the display driver 200 may be disposed in the sub-area SA, and may overlap the main area MA in the thickness direction (third direction DR3) by bending the sub-area SA. In an embodiment, the display driver 200 may be mounted on the flexible printed circuit board 300.

The flexible printed circuit board 300 may include a body part 310, a pressing part 320 (i.e., a connection part), a tail part 330, and a connection terminal 340.

The body part 310 may occupy the largest area of the flexible printed circuit board 300 and may be multi-layered. For example, the body part 310 may include four or more conductive layers stacked on each other. Components such as a touch driver 400, a capacitor, a resistor, and an inductor may be disposed on the body part 310.

The pressing part 320 may be located along an edge of the body part 310. The pressing part 320 may extend in the first direction DR1 which extends along a shorter side of the first display area DA1.

The pressing part 320 may be bonded to the pad area of the display panel 100 using an electrical and physical bonding means such as an anisotropic conductive film. Pads located in the pressing part 320 of the flexible printed circuit board 300 may be electrically connected to pads located in the pad area of the display panel 100. The pressing part 320 may include one or more conductive layers. The number of conductive layers included in the pressing part 320 may be less than the number of conductive layers included in the body part 310. For example, the pressing part 320 may include one or two layers as conductive layers, and the body part 310 may include four or more layers as conductive layers.

The tail part 330 may extend from the body part 310 in a direction away from the body part 310, and a connection terminal 340 may be formed at an end of the tail part 330. The tail part 330 may be bent one or more times in a plane. In an embodiment, the tail part 330 may have a planar shape such as an "L" shape. For example, the tail part 330 may include a first portion 331 connected to the body part 310 and a second portion 332 connected to the first portion. The first portion 331 may extend from the body part 310 along the second direction DR2 in a direction away from the body part 310. The second portion 332 may extend from the first portion along the first direction DR1. In an embodiment, the tail part 330 may be straight in a plane. The tail part 330 may be bent so that at least a portion of the tail part 330 overlaps the body part 310. At least a portion of the tail part 330 may be attached to the body part 310. The number of conductive layers included in the tail part 330 may be less than the number of conductive layers included in the body part 310. For example, the tail part 330 may include one or two layers as conductive layers, and the body part 310 may include four or more conductive layers. In an embodiment, the pressing part 320 may be disposed along a first edge of the body part 310 and bonded to a pad area DPA, which will be described with reference to FIG. 3. The tail part 330 may extend from a second edge, opposite to the first edge, of the body part 310.

The connection terminal 340 may be located at the edge of the tail part 330. The connection terminal 340 may include connection terminals connected to wirings of the tail part 330. The connection terminal 340 is connected to an external device such as a graphics system and a power system to receive digital video data and power. A mobile industry processor interface (MIPI) may be used for high-speed transmission of digital video data. Signals and power applied through the connection terminal 340 may be transmitted to the wires arranged in the body part 310 through the wires arranged in the tail part 330.

The touch driver 400 may be provided as an integrated circuit chip and may be mounted on the flexible printed circuit board 300. The touch driver 400 may be electrically connected to a touch sensor included in the electronic device 1. The touch sensor may be provided in the display area DA of the display panel 100. The touch driver 400 may supply an input signal (touch drive signal) to the detection electrodes of the touch sensing unit, and can detect the amount of change in the capacitance between the sensing electrodes based on an output signal (touch sensing signal) from the sensing electrodes. For example, the touch driving signal may be a pulse signal with a predetermined frequency. The touch driver 400 may calculate whether a touch is performed and the touch coordinates based on the amount of change in capacitance between the sensing electrodes.

Figure 3:
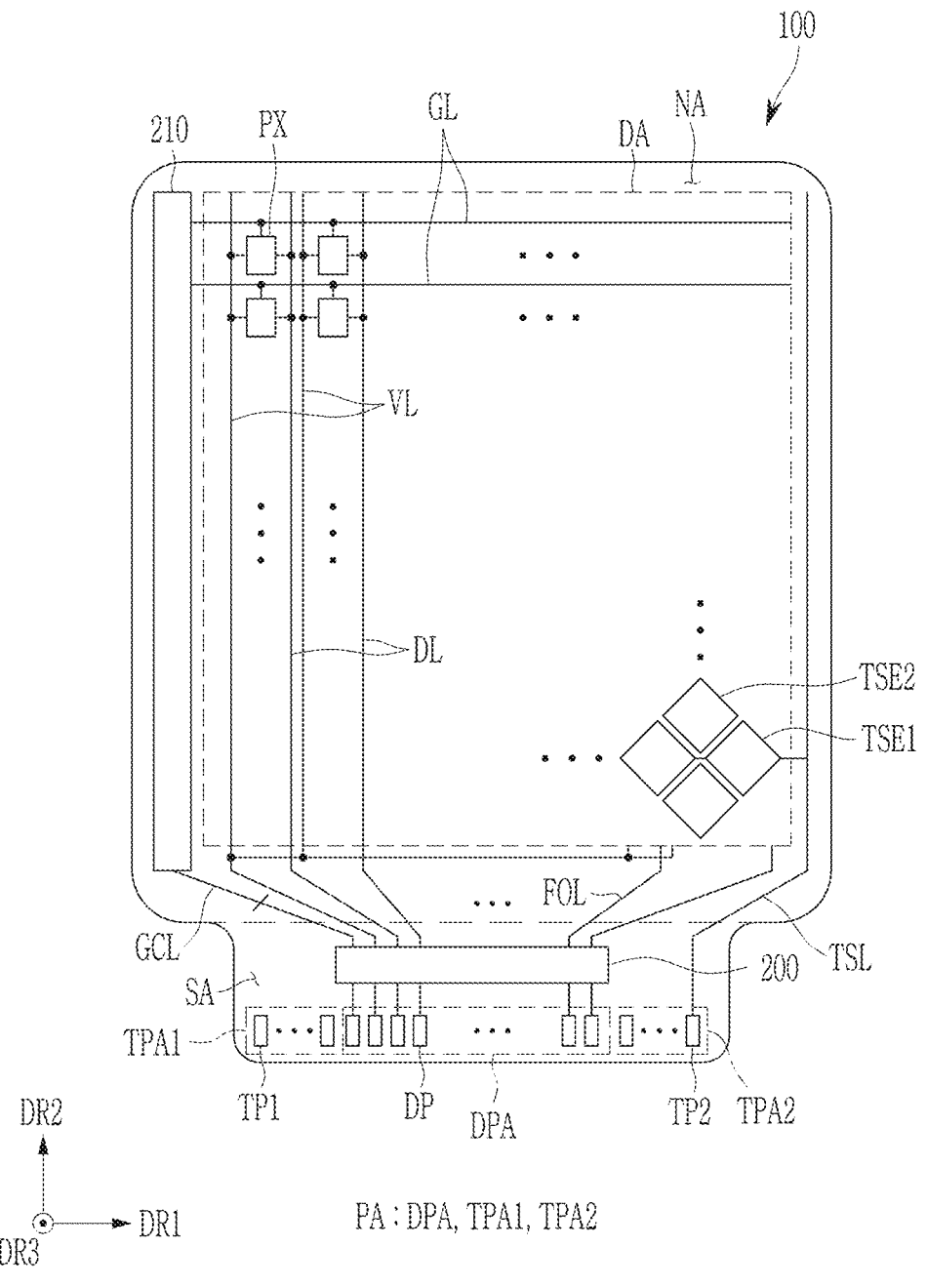
FIG. 3 is a plan view showing a connection relationship between components of a display device according to an embodiment of the present disclosure.

FIG. 3 is a plan view showing the connection relationship between components of a display device according to an embodiment.

Referring to FIG. 3, the display panel 100 of the display device 30 may include a display area DA and a non-display area NA. The display area DA may be located in the middle of the display panel 100. Unit pixels PX, gate lines GL, data lines DL, and power lines VL may be arranged in the display area DA. Each unit pixel PX is a minimum unit that emits light, and may include a pixel circuit portion including a transistor and a capacitor, and a light-emitting element that receives a driving current from the pixel circuit portion. The unit pixel PX may be connected to a gate line GL, a data line DL, and a power line VL. The unit pixel PX may be repeatedly arranged in the display area DA.

The gate lines GL may supply gate signals applied from the gate driver 210 to the unit pixels PX. The gate lines GL may extend in the first direction DR1 and may be spaced apart from each other in the second direction DR2. The data lines DL may supply data voltages applied from the display driver 200 to the unit pixels PX. The data lines DL may extend in the second direction DR2 and may be spaced apart from each other in the first direction DR1. The power lines VL may supply power voltages applied from the display driver 200 to the unit pixels PX. The power supply voltages may include a high-potential power supply voltage (or driving voltage), a low-potential power supply voltage (or common voltage), an initialization voltage, etc., and these power voltages may be transmitted to the unit pixels PX. The power lines VL may extend in the second direction DR2 and may be spaced apart from each other in the first direction DR1.

Sensing electrodes TSE1 and TSE2 that detect a touch may be disposed in the display area DA. The sensing electrodes TSE1 and TSE2 may include first sensing electrodes TSE1 arranged in the first direction DR1 and second sensing electrodes TSE2 arranged in the second direction DR2.

The non-display area NA may surround the display area DA. A gate driver 210, fan-out lines FOL, gate control lines GCL, touch signal lines TSL, etc., may be disposed in the non-display area NA. The gate driver 210 may generate gate signals based on gate control signals and supply the gate signals to the gate lines GL in a set order. The fan-out lines FOL may extend from the display driver 200 to the display area DA. The fan-out lines FOL may transmit data voltages output from the display driver 200 to the data lines DL. The gate control lines GCL may extend from the display driver 200 to the gate driver 210. The gate control lines GCL may transmit gate control signals output from the display driver 200 to the gate driver 210. The touch signal lines TSL may electrically connect the touch pads (TP1, TP2) to the sensing electrodes (TSE1, TSE2).

The display panel 100 may include a sub-area SA. The display driver 200 may be located in the sub-area SA. The sub-area SA may include the pad area PA to which the flexible printed circuit board 300 is connected.

The display driver 200 may output signals and voltages for driving the display panel 100. The display driver 200 may supply data voltages to the data lines DL through the fan-out lines FOL. Data voltages may be supplied to the unit pixels PX, and the luminance of the unit pixels PX may be controlled therewith. The display driver 200 may supply gate control signals to the gate driver 210 through gate control lines GCL.

The pad area PA may be formed at the edge of the sub-area SA. The pad area PA may include a display pad area DPA, a first touch pad area (voltage line VL1) TPA1, and a second touch pad area TPA2. Display pads DP may be disposed in the display pad area DPA. The display pads DP may be connected to a graphics system through the flexible printed circuit board 300. The display pads DP are connected to the flexible printed circuit board 300 and may receive digital video data and supply digital video data to the display driver 200. The first touch pad area TPA1 and the second touch pad area TPA2 may be located on opposite sides of the display pad area DPA. For example, the display pad area DPA may be disposed in a space between the first touch pad area TPA1 and the second touch pad area TPA2. The first touch pad area TPA1, the display pad area DPA, and the second touch pad area TPA2 may be arranged along the first direction DR1. Touch pads TP1 and TP2 may be disposed in the first touch pad area TPA1 and the second touch pad area TPA2. The touch pads TP1 and TP2 may be connected to the sensing electrodes TSE1 and TSE2 located in the display area DA and the touch driver 400 located on the flexible printed circuit board 300 to detect a touch. The pad area PA, the first touch pad area TPA1, and the second touch pad area TPA2 are electrically connected to the flexible printed circuit board 300 by an anisotropic conductive film (ACF) or a self-assembly anisotropic conductive paste (SAP).

Figure 4:
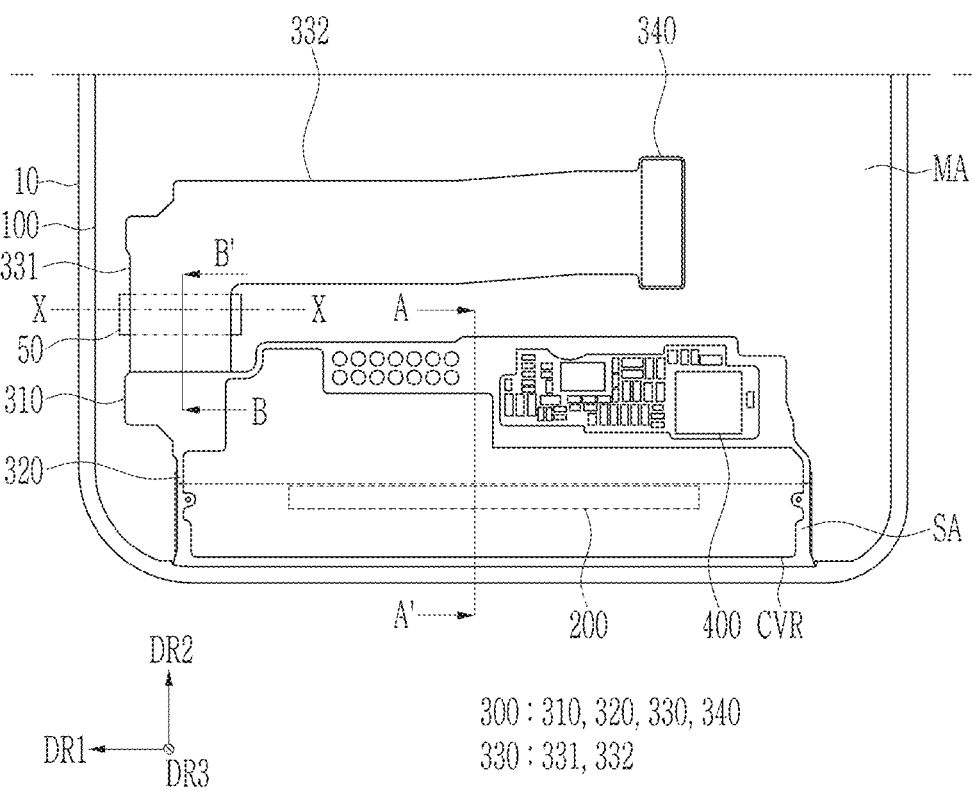
FIG. 4 is a rear view of a display device according to an embodiment of the present disclosure.
Figure 5:
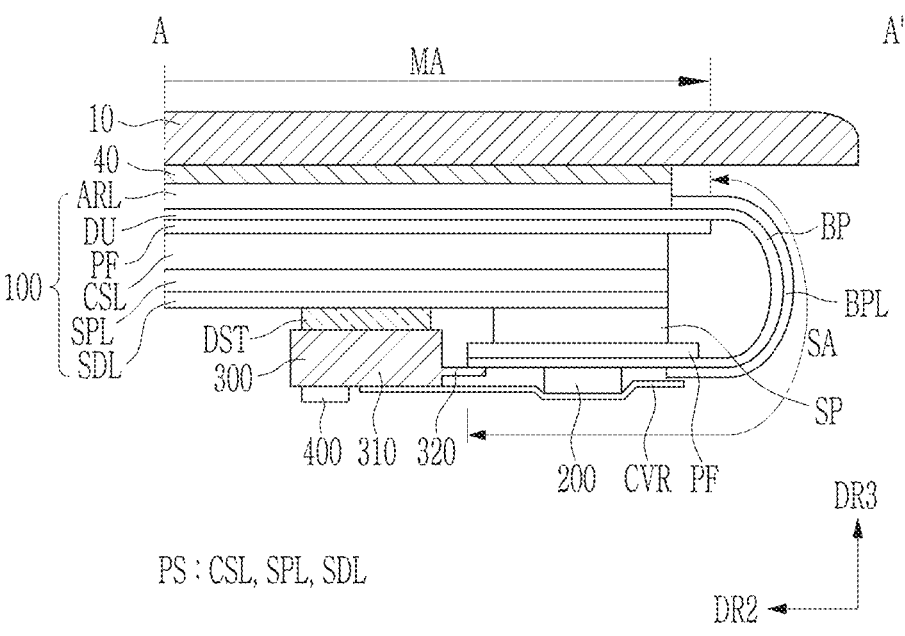
FIG. 5 is a cross-sectional view taken along line A-A' in FIG. 4 according to an embodiment of the present disclosure.
Figure 6:
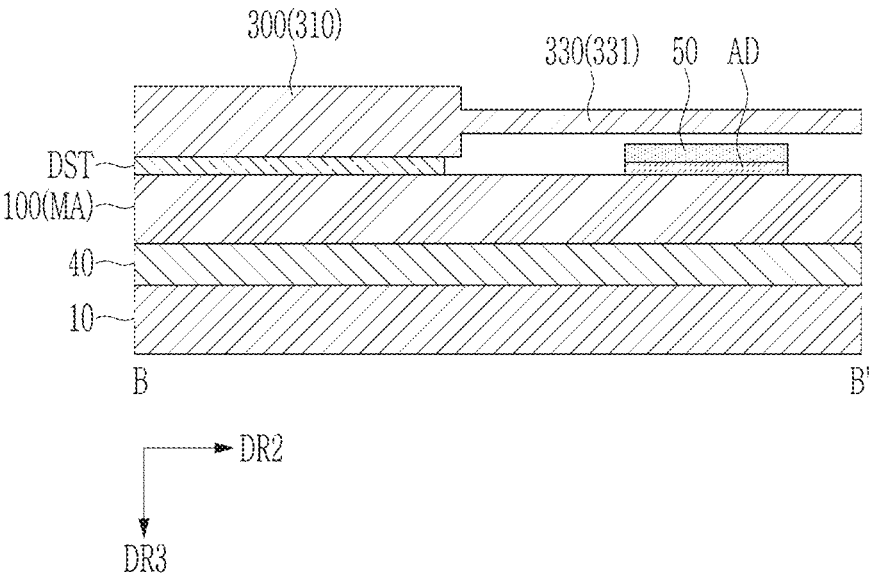
FIG. 6 is a cross-sectional view taken along line B-B' in FIG. 4 according to an embodiment of the present disclosure.
Figure 7:
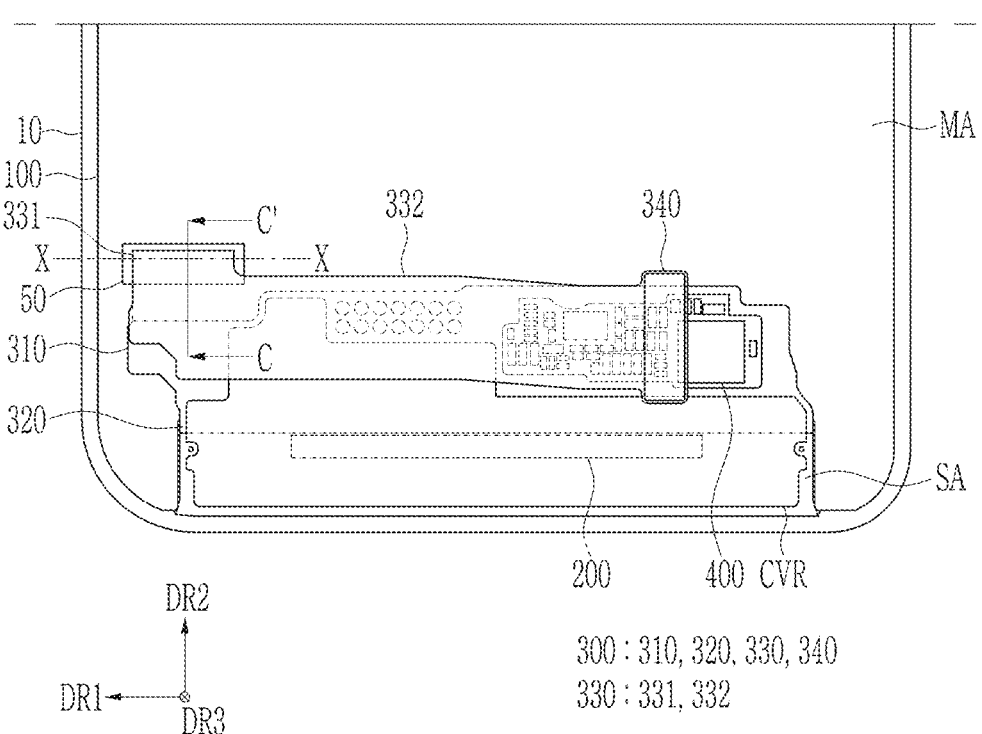
FIG. 7 is a rear view of a display device according to an embodiment of the present disclosure.
Figure 8:
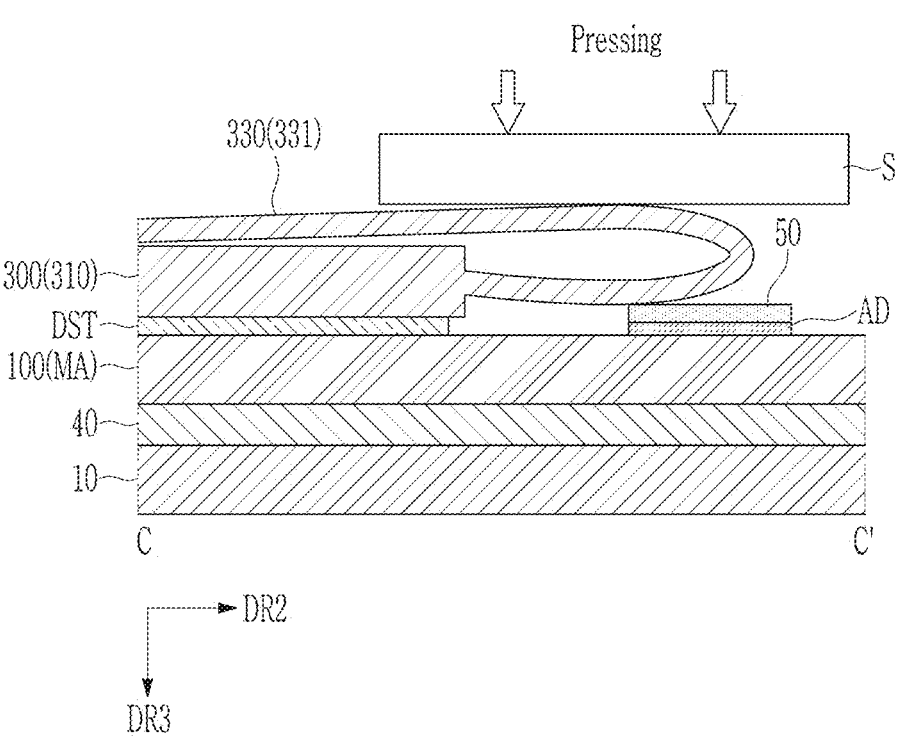
FIG. 8 is a cross-sectional view taken along line C-C' in FIG. 7 according to an embodiment of the present disclosure.
Figure 9:
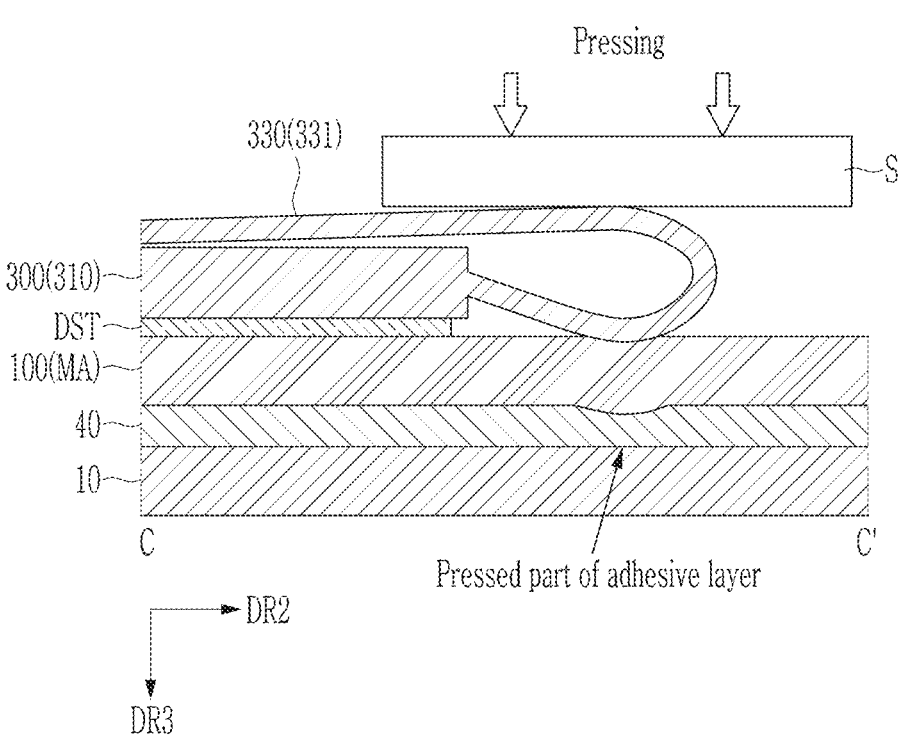
FIG. 9 is a cross-sectional view of a display device according to a comparative example.

FIG. 4 is a rear view of a display device according to an embodiment, FIG. 5 is a schematic cross-sectional view taken along line A-A' in FIG. 4, and FIG. 6 is a cross-sectional view taken along line B-B' in FIG. 4. FIG. 7 is a rear view of a display device according to an embodiment, and FIG. 8 is a cross-sectional view taken along line C-C' in FIG. 7. FIG. 9 is a cross-sectional view of a display device according to a comparative example.

FIGS. 4, 5, and 6 show the sub-area SA of the display panel 100 and the area where the flexible printed circuit board 300 is located in the display device according to an embodiment. FIGS. 7 and 8 show a state in which the tail part 330 of the flexible printed circuit board 300 in the display device shown in FIGS. 4 and 6 is bent.

The display panel 100 may be attached to the cover window 10 by an adhesive layer 40 such as an optically clear adhesive (OCA).

The sub-area SA of the display panel 100 may include a bending part BP, and the bending part BP is bent so that a portion of the sub-area SA is located on the back of the main area MA, and the display driver 200 located in the sub-area SA may be located on the back of the main area MA. To maintain the bent state of the sub-area SA, the sub-area SA may be attached to the back of the main area MA using a spacer SP including an adhesive layer on opposite sides or a double-sided tape. The flexible printed circuit board 300, in which the pressing part 320 is bonded to the pad area PA of the sub-area SA, may be positioned on the back of the main area MA as the sub-area SA is bent. The body part 310 of the flexible printed circuit board 300 may be attached to the back of the main area MA using double-sided tape DST or a spacer SP including an adhesive layer on both sides.

In the flexible printed circuit board 300, the tail part 330 may extend from the body part 310. The tail part 330 may have fewer layers and a smaller thickness than the body part 310.

For example, the body part 310 may be four layers or more, and the tail part 330 may be three layers or less. For example, the body part 310 may have 6 layers, and the tail part 330 may have 2 layers.

The tail part 330 may include a first portion 331 extending in a second direction DR2 from the body part 310, and a second portion 332 extending in a direction parallel to the first direction DR1 from the first portion 331. The connection terminal 340 may be located at the end of the second portion 332. In order to secure more space above the flexible printed circuit board 300 in the electronic device 1, the tail part 330 may be bent. For example, as shown in FIGS. 7 and 8, the first portion 331 of the tail part 330 may be bent about the axis X. The axis X may be parallel to the first direction DR1. Accordingly, at least a portion of the second portion 332 of the tail part 330 may overlap the body part 310, and the space above the flexible printed circuit board 300 may be larger than before the tail part 330 is bent, and it may be expanded by approximately the width of the tail part 330. For example, the footage where the flexible printed circuit board 300 may be reduced by the width, in the second direction DR2, of the tail part 330. As the area occupied by the flexible printed circuit board 300 is reduced, space utilization within the electronic device 1 increases, and, for example, the area where a battery may be placed may be increased.

The bent portion of the tail part 330 may be pressed in the third direction DR3 by the structure S or other components within the housing 20. Due to this, for example, as shown in FIG. 9, the adhesive layer 40 located between the display panel 100 and the cover window 10 may be pressed. The depressed portion of the adhesive layer 40 may be visible as a stain through the cover window 10. In order to alleviate the pressing phenomenon of the adhesive layer 40, as shown in FIGS. 4, 6, 7, and 8, a buffer layer 50 may be positioned between the main area MA and the first portion 331 of the tail part 330, and the first portion 331 may overlap the buffer layer 50. For example, the first portion 331 may be bent about the axis X, and the bent portion of the first portion 331 may vertically overlap the buffer layer 50. The buffer layer 50 may be positioned between the second portion 332 of the tail part 330 and the body part 310 in the second direction DR2. The buffer layer 50 may be attached to the back of the display panel 100 using an adhesive AD such as a pressure sensitive adhesive (PSA).

The buffer layer 50 may alleviate local pressure on the display panel 100 and the adhesive layer 40 by spreading the pressure stress caused by the bent portion when the first portion 331 of the tail part 330 is bent. The buffer layer 50 may increase the pressing range of the adhesive layer 40, but since the pressing degree (depth) is reduced, the pressed portion of the adhesive layer 40 may become invisible. By positioning the buffer layer 50 between the bent portion of the tail part 330 and the display panel 100, the bent portion of the tail part 330 may be in contact with the buffer layer 50 and not in contact with the display panel 100.

The buffer layer 50 may have a substantially square planar shape, but may also have various planar shapes such as a circular shape and an oval shape suitable for dispersing stress applied by the bent portion of the tail part 330. If the area of the buffer layer 50 is large, it may be advantageous to widely distribute stress, but the size of the buffer layer 50 may be designed in consideration of interference with other structures or components inside the electronic device 1. The width, in the first direction DR1, of the buffer layer 50 may be greater than or equal to the width, in the first direction DR1, of the first portion 331 of the tail part 330. The width of the buffer layer 50 in the second direction DR2 may be about 2.0 mm to about 5.0 mm, or about 3.0 mm to about 4.0 mm, for example, about 3.5 mm. The buffer layer 50 may have a thickness of about 0.2 mm or less, for example, about 0.05 to about 0.2 mm.

Compressive stress may be increased due to the thickness of the buffer layer 50, but if the thickness of the buffer layer 50 is too thin, it may be difficult to disperse the stress. The distance in the second direction DR2 between the buffer layer 50 and the body part 310 may be about 0.1 mm to about 5.0 mm. To allow compressive stress to be spread widely throughout the buffer layer 50, the buffer layer 50 may have a relatively high modulus (also referred to as modulus of elasticity), or relative high stiffness. For example, the buffer layer 50 may have a modulus of about 10 GPa or more or about 100 GPa or more. The buffer layer 50 may be made of metal or metal alloy, for example, stainless steel (also called stainless use steel (SUS) or steel type stainless (STS)). The buffer layer 50 may be made of a polymer such as polyethylene terephthalate and polyimide, or a ceramic material. A flexible printed circuit board 300 with a 6-layer and 0.3 mm thick body part 310 and a 2-layer and 0.12 mm thick tail part 330 was used to simulate the pressing of the adhesive layer 40 during the bending of the tail part 330. When a 0.08 mm thick buffer layer 50 made of stainless steel and a 0.05 mm thick adhesive AD are applied, the pressure applied by the bent portion of the tail part 330 to the adhesive layer 40 is about 27% compared to the case where the buffer layer 50 is not applied as in the comparative example.

At least a portion of the display driver 200, the sub-area SA, and the flexible printed circuit board 300 may be covered by a cover CVR. The cover CVR may be attached to the display driver 200, the sub-area SA, and the flexible printed circuit board 300. The cover CVR may cover at least a portion of the display driver 200 and the flexible printed circuit board 300 to protect them from electromagnetic interference (EMI) and electrostatic discharge (ESD). The cover CVR may prevent the display driver 200, the pressing part 320, etc., from contacting the external objects and protect them from physical damage due to friction. The tail part 330 of the flexible printed circuit board 300 may not be covered by the cover CVR. The cover CVR can be made of a flexible material that may shield EMI or ESD. For example, the cover CVR may be in the form of a tape including a metal layer. The metal layer of the cover CVR may include a metal foil, a metal fabric, or a metal mesh. An adhesive layer may be located on one side of the cover CVR. For example, an adhesive may be applied to one side of the cover CVR or double-sided tape may be attached.

In an embodiment, the display panel 100 may include a display unit DU, a touch sensing unit (not shown) and a reflection reduction layer ARL, disposed on the display unit DU, and a protection film PF and a protection sheet PS disposed below the display unit DU.

The display unit DU may include a substrate and a driving element layer, a light-emitting element layer, and an encapsulation layer located on the substrate.

The substrate may be a base substrate or a base member. The substrate may be a flexible substrate containing a polymer resin such as polyimide, polyamide, and polyethylene terephthalate. The substrate may be a rigid substrate made of a material such as glass.

The driving element layer may be located on the substrate. The driving element layer may include transistors and capacitors that constitute pixel circuit units that output driving currents to light-emitting elements. The driving element layer may include gate lines, data lines, power lines, gate control lines, fanout lines connecting the display driver 200 to the data lines, and lead lines connecting the display driver 200 to the display pads DP. The driving element layer may include transistors and capacitors constituting the gate driver, and gate control lines. The driving element layer may include conductive layers, semiconductor layers, and insulating layers. The insulating layers may be configured to insulate transistors, capacitors, and signal lines by a combination thereof.

The light-emitting element layer may be located on the driving device layer and may include light-emitting elements and corresponding light-emitting regions. The light-emitting element layer may include a pixel defining layer having openings defining light-emitting areas.

The encapsulation layer (or referred to as a thin film encapsulation layer) may cover the top and side surfaces of the light-emitting element layer and prevent moisture or oxygen from penetrating into the light-emitting element layer from the outside. The encapsulation layer may include one or more inorganic layers and one or more organic layers.

The touch sensing unit may include an encapsulation layer and may include sensing electrodes TSE1 and TSE2. The sensing electrodes TSE1 and TSE2 may sense the user's touch using a mutual capacitance method and/or a self-capacitance method.

The reflection reduction layer ARL may reduce the amount of light incident on the display panel 100 from the outside and reflected by the display panel 100. The reflection reduction layer ARL may include a polarizing layer. The reflection reduction layer ARL may include a combination of a color filter and a light blocking member instead of a polarizing layer.

The protection film PF may be attached to the back of a substrate SB, which will be described with reference to FIG. 12, and may protect the display panel 100 during the manufacturing process of the display device 30. The protection film PF may not be located in the bending portion BP of the sub-area SA. A bending protection layer BPL (or stress neutralization layer) may be positioned on the bending portion BP to relieve stress applied to the wiring located in the bending portion BP.

The protection sheet PS may be attached to the back of the protection film PF and may protect the display panel 100 from the environment behind the display panel 100 (e.g., shock, electromagnetic waves, heat, noise, etc.). The protection sheet PS may be located in the main area MA and not in the sub-area SA. The protection sheet PS may have a structure in which a shielding layer SDL, a support layer SPL, and a cushion layer CSL are laminated. The protection sheet PS may define the rear surface of the display panel 100. The above-described cushion layer CSL may be attached to the back of the protection sheet PS or may be in contact with the back of the protection sheet PS.

The shielding layer SDL may prevent EMI from flowing into the display panel 100 from the back of the display panel 100. The shielding layer SDL may be a metal layer containing a metal with excellent shielding performance and thermal conductivity, such as copper and aluminum.

The support layer SPL may be provided to secure the strength of the protection sheet PS and to couple/separate the cushion layer CSL from other layers or members. The support layer SPL may be a plastic layer made of a polymer such as polyethylene terephthalate and polyimide.

The cushion layer CSL may absorb shock and prevent the display panel 100 from being damaged. For example, the cushion layer CSL may prevent external impact from causing damage to the display panel 100 by relieving shock and stress applied when the electronic device 1 is dropped. The cushion layer CSL may be a porous layer formed of a material such as polyurethane and polyethylene. The cushion layer CSL may include or may be formed of a foam resin.

An adhesive layer such as pressure sensitive adhesive (PSA) may be positioned between the shielding layer SDL and the support layer SPL and between the support layer SPL and the cushion layer CSL to attach them with each other. In addition to the above-described layers, the protection sheet PS may further include functional layers such as a light blocking layer and a heat dissipation layer.

Figure 10:
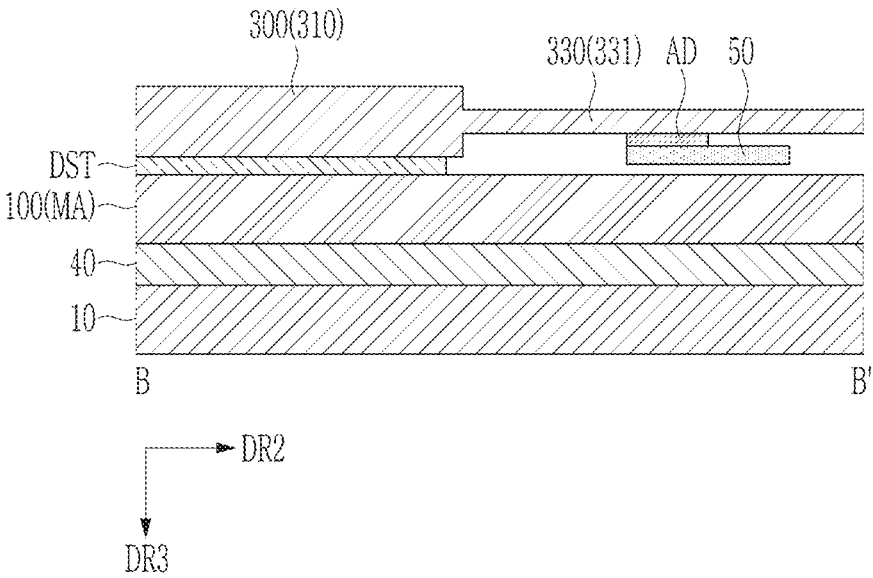
FIG. 10 and FIG. 11 are schematic cross-sectional views of a display device according to an embodiment of the present disclosure.
Figure 11:
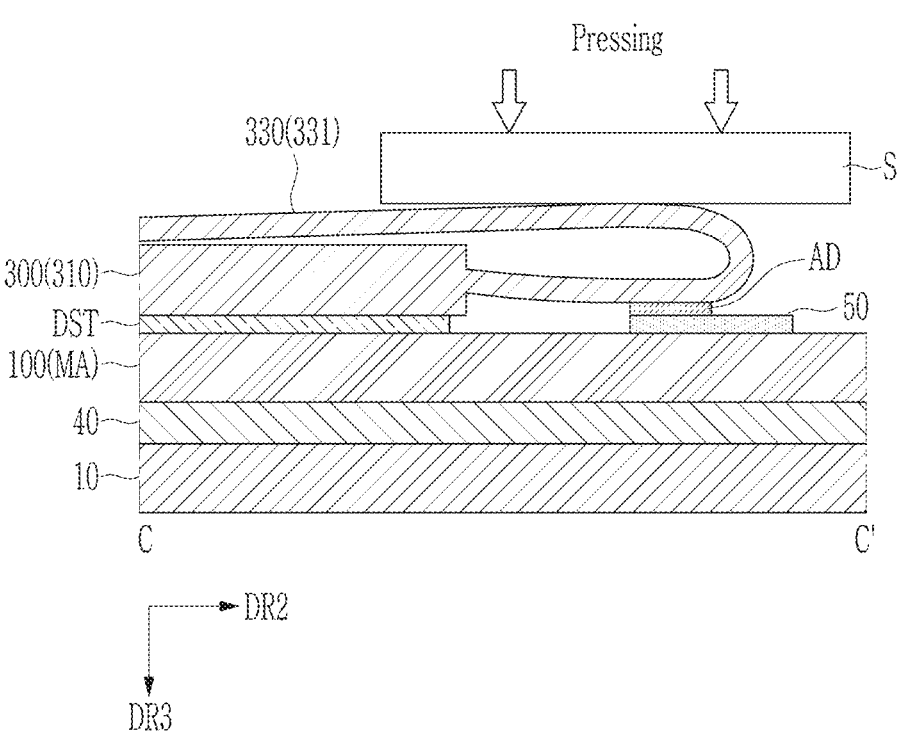

FIG. 10 and FIG. 11 are cross-sectional views of a display device according to an embodiment.

FIGS. 10 and 11 may show a cross-section taken along line B-B' in FIG. 4 and a cross-section taken along line C-C' in FIG. 7, respectively. The embodiments of FIGS. 10 and 11 are similar to the embodiments of FIGS. 6 and 8, but differ in that the buffer layer 50 is attached to the tail part 330 of the flexible printed circuit board 300. That is, the buffer layer 50 is attached to the first portion 331 of the tail part 330 using an adhesive AD, rather than to the back of the display panel 100. For natural bending of the first portion 331 of the tail part 330, the adhesive AD may be applied with a narrower width than the width of the buffer layer 50 in the second direction DR2, and the adhesive AD may not be located in the portion of the buffer layer 50 that is located away from the body part 310. That is, a portion of the buffer layer 50 located far from the body part 310 in the second direction DR2 may not be attached to the first portion 331. If the entire buffer layer 50 is attached to the first portion 331 of the tail part 330, the buffer layer 50 holds the first portion 331, thereby interfering with bending of the first portion 331 about the axis X. The width of the adhesive AD in the second direction DR2 may be about two thirds or less, about half or less, or about one third or less of the width of the buffer layer 50. About two thirds or less, about half or less, or about one third or less of the planar area of the buffer layer 50 may be attached to the first portion 331 using the adhesive AD.

Although not shown, the buffer layer 50 may be attached to both the back surface of the display panel 100 and the first portion 331 of the tail part 330. For example, in the embodiment shown in FIG. 10, an adhesive AD as shown in FIG. 6 may be positioned between the buffer layer 50 and the display panel 100.

Figure 12:
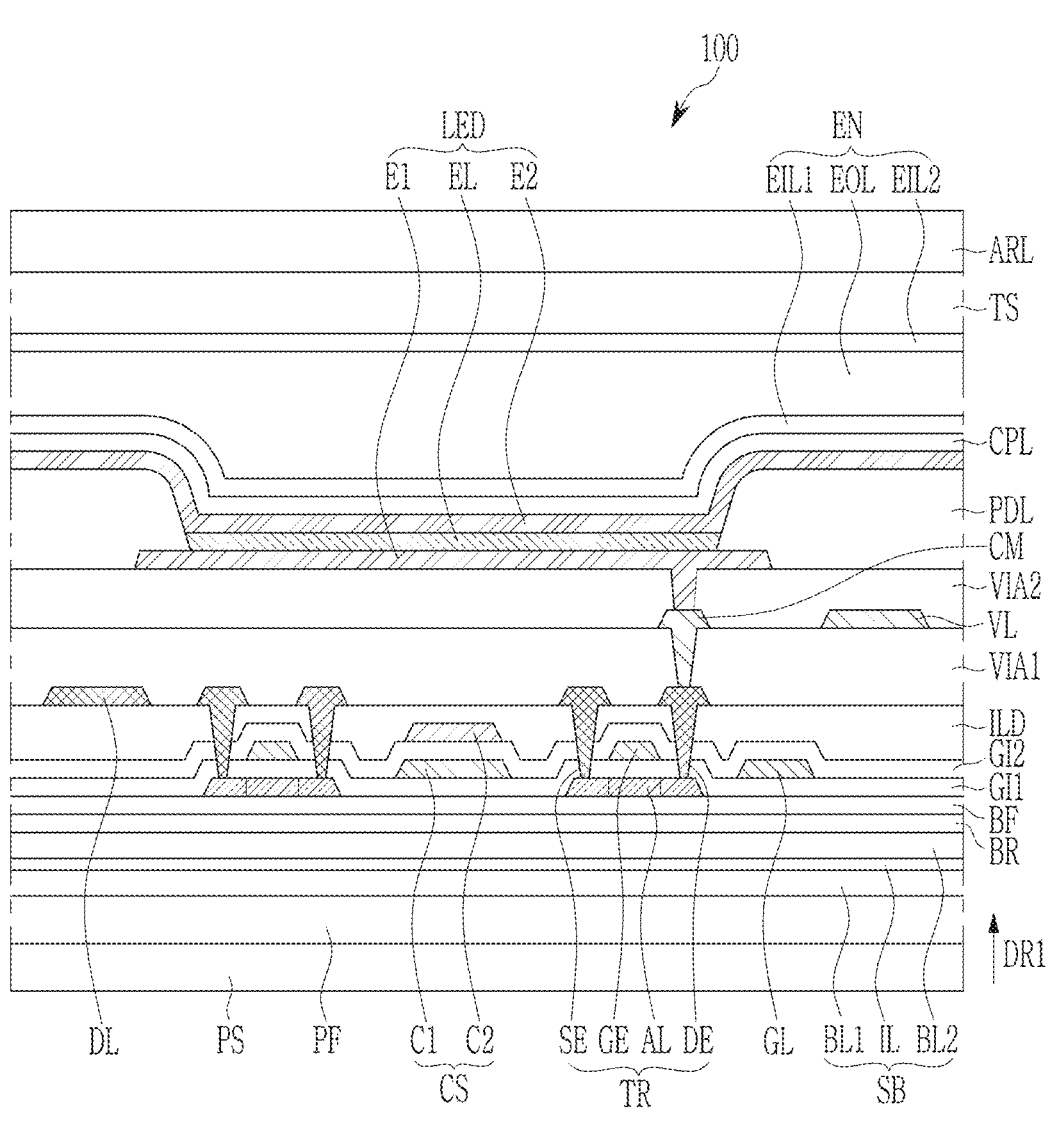
FIG. 12 is a schematic cross-sectional view of a display panel according to an embodiment of the present disclosure.

FIG. 12 is a cross-sectional view of a display panel according to an embodiment.

Referring to FIG. 12, to the cross-sectional view shows one pixel area. The display panel 100 includes a substrate SB, a transistor TR formed on the substrate SB, and a light-emitting diode LED connected to the transistor TR. The light-emitting diode LED may correspond to a pixel.

The substrate SB may be a flexible substrate capable of bending, folding, rolling, etc. The substrate SB may be a multi-layer including a first base layer BL1, an inorganic layer IL, and a second base layer BL2. The first base layer BL1 and the second base layer BL2 may include a polymer resin such as a polyimide, a polyamide, and polyethylene terephthalate. A barrier layer BR may be positioned on the substrate SB to prevent moisture, oxygen, etc. from penetrating into the light-emitting diode LED. The barrier layer BR may include or may be formed of an inorganic insulating material such as a silicon nitride ($SiN_x$), a silicon oxide ($SiO_x$), and a silicon nitride ($SiO_xN_y$), and may be a single layer or multiple layers.

A buffer layer BF may be located on the barrier layer BR. The buffer layer BF may improve the characteristics of the semiconductor layer by blocking impurities from diffusing into the substrate SB when forming the semiconductor layer, and may relieve stress of the semiconductor layer by flattening the surface of the substrate SB. The buffer layer BF may include or may be formed of an inorganic insulating material such as a silicon nitride, a silicon oxide, and a silicon oxynitride, and may be a single layer or multiple layers. The buffer layer BF may include or may be formed of amorphous silicon (a-Si).

The semiconductor layer AL of the transistor TR may be located on the buffer layer BF. The semiconductor layer AL may include a first region, a second region, and a channel region between these regions. The semiconductor layer AL may include or may be formed of any one of amorphous silicon, polycrystalline silicon, and an oxide semiconductor. The oxide semiconductor may include at least one of zinc (Zn), indium (In), gallium (Ga), and tin (Sn). For example, the semiconductor layer AL may include or may be formed of low-temperature polycrystalline silicon (LTPS) or indium-gallium-zinc oxide (IGZO).

A first gate insulating layer GI1 may be located on the semiconductor layer AL.

The first gate insulating layer GI1 may include or may be formed of an inorganic insulating material such as a silicon nitride, a silicon oxide, and a silicon oxynitride, and may be a single layer or a multilayer.

On the first gate insulating layer GI1, a first gate conductive layer that may include the gate electrode GE of the transistor TR, the gate line GL, the first electrode C1 of the storage capacitor CS may be located. The first gate conductive layer may include or may be formed of molybdenum (Mo), aluminum (Al), copper (Cu), or titanium (Ti), and may be a single layer or a multilayer.

A second gate insulating layer GI2 may be located on the first gate conductive layer. The second gate insulating layer GI2 may include or may be formed of an inorganic insulating material such as a silicon nitride, a silicon oxide, and a silicon oxynitride, and may be a single layer or a multilayer.

A second gate conductive layer that may include the second electrode C2 of the storage capacitor CS may be positioned on the second gate insulating layer GI2. The second gate conductive layer may include molybdenum (Mo), aluminum (Al), copper (Cu), or titanium (Ti), and may be a single layer or a multilayer.

An interlayer insulating layer ILD may be positioned on the second gate insulating layer GI2 and the second gate conductive layer. The interlayer insulating layer ILD may include or may be formed of an inorganic insulating material such as a silicon nitride, a silicon oxide, and a silicon oxynitride, and may be a single layer or multiple layers.

A first data conductive layer that may include the first electrode SE and a second electrode DE of the transistor TR, the data line DL may be located on the interlayer insulating layer ILD. The first electrode SE and the second electrode DE may be respectively connected to the first and second regions of the semiconductor layer AL through contact holes of the insulating layers GI1, GI2, and ILD. One of the first electrode SE and the second electrode DE may be a source electrode and the other may be a drain electrode. The first data conductive layer may include or may be formed of a metal such as aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and may be a single layer or multiple layers.

A first planarization layer VIA1 may be located on the first data conductive layer. The first planarization layer VIA1 may include or may be formed of organic insulating materials such as general-purpose polymers such as poly(methyl methacrylate) and polystyrene, polymer derivatives with a phenol group, acrylic polymers, imide polymers (for example, polyimide), siloxane polymers, and so on.

A second data conductive layer that may include a power line VL and a connection member CM may be located on the first planarization layer VIA1. The power line VL may transmit voltages such as a driving voltage, a common voltage, an initialization voltage, and a reference voltage. The connection member CM may be connected to the second electrode DE of the transistor TR through a contact hole in the first planarization layer VIA1. The second data conductive layer may include or may be formed of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), or copper, and may be a single layer or multiple layers.

A second planarization layer VIA2 may be located on the second data conductive layer. The second planarization layer VIA2 may include or may be formed of an organic insulating material such as general-purpose polymers such as poly(methyl methacrylate) and polystyrene, a polymer derivative having a phenolic group, an acrylic polymer, an imide polymer, and a siloxane polymer.

The first electrode E1 of the light-emitting diode LED may be located on the second planarization layer VIA2. The first electrode E1 may be referred to as a pixel electrode. The first electrode E1 may be connected to the connection member CM through a contact hole in the second planarization layer VIA2. Accordingly, the first electrode E1 is electrically connected to the second electrode DE of the transistor TR and may receive a driving current that controls the brightness of the light-emitting diode. The transistor TR to which the first electrode E1 is connected may be a driving transistor or a transistor electrically connected to the driving transistor. The first electrode E1 may be formed of a reflective conductive material or a semi-transparent conductive material, or may be formed of a transparent conductive material. The first electrode E1 may include a transparent conductive material such as indium tin oxide ITO and indium zinc oxide IZO. The first electrode E1 may include lithium (Li), calcium (Ca), aluminum (Al), silver (Ag), magnesium (Mg), gold (Au), etc.

A pixel defining layer PDL may be positioned on the second planarization layer VIA2 and the first electrode E1. The pixel defining layer PDL may be referred to as a bank or a partition, and may have an opening that overlaps the first electrode E1. The pixel defining layer PDL may include or may be formed of organic insulating materials such as general-purpose polymers such as poly(methyl methacry-late) and polystyrene, polymer derivatives with phenolic groups, acrylic polymers, imide polymers, and siloxane polymers.

The light-emitting layer EL of the light-emitting diode LED may be located on the first electrode E1. In addition to the light-emitting layer EL, a functional layer including at least one of a hole injection layer, a hole transport layer, an electron transport layer, and an electron injection layer may be positioned on the first electrode E1.

The second electrode E2 of the light-emitting diode LED may be located on the light-emitting layer EL. The second electrode E2 may be called a common electrode. The second electrode E2 provides light transparency by forming a thin layer of metal or metal alloy with a low work function, such as calcium (Ca), barium (Ba), magnesium (Mg), aluminum (Al), and silver (Ag). The second electrode E2 may include or may be formed of a transparent conductive oxide such as indium tin oxide ITO and indium zinc oxide IZO.

The first electrode E1, the light-emitting layer EL, and the second electrode E2 of each pixel may form a light-emitting diode LED such as an organic light-emitting diode. The first electrode E1 may be an anode and the second electrode E2 may be a cathode. The light-emitting area of a light-emitting diode LED may correspond to a pixel.

A capping layer CPL may be positioned on the second electrode E2. The capping layer CPL may improve light efficiency by adjusting the refractive index. The capping layer CPL may be positioned to entirely cover the second electrode E2. The capping layer CPL may include or may be formed of an organic insulating material or an inorganic insulating material.

An encapsulation layer EN may be located on the capping layer CPL. The encapsulation layer EN may seal the light-emitting diode LED and prevent moisture or oxygen from penetrating from the outside.

The encapsulation layer EN may be a thin film encapsu-lation layer in which the organic layer EOL is located between the first inorganic layer EIL1 and the second inorganic layer EIL2.

A touch sensor layer TS including touch electrodes may be positioned on the encapsulation layer EN. A reflection reduction layer ARL may be located on the touch sensor layer TS to reduce external light reflection.

A protection film PF may be located under the substrate SB. The protection film PF may protect the display panel 100 during the manufacturing process of the display device. The protection film PF may include polymers such as polyethylene terephthalate, silicone-based polymers (e.g., polydimethylsiloxane), and elastomers (e.g., elastomeric polyurethane).

A protection sheet PS may be located under the protection film PF. For example, the protection sheet PS may have the structure described above with reference to FIG. 5.

Although the embodiments have been described in detail above, the scope of the inventive concept is not limited thereto, and various modifications and improvements made by those skilled in the art using the basic concepts defined in the following claims are also possible.

What is claimed is:

1. A display device, comprising:
a display panel including a pad area;
a flexible printed circuit board connected to the display panel; and
a buffer layer disposed between the display panel and the flexible printed circuit board,
wherein the flexible printed circuit board includes a body part on which components are arranged, a connection part disposed along a first edge of the body part and bonded to the pad area, and a tail part extending from a second edge, opposite to the first edge, of the body part,
wherein the tail part vertically overlaps the buffer layer,
wherein the tail part includes a bent portion, and
wherein the bent portion vertically overlaps the buffer layer.

2. The display device of claim 1,
wherein the connection part extends in a first direction parallel to a shorter side of the display panel,
wherein the tail part includes;
a first portion extending from the second edge of the body part in a second direction parallel to a longer side of the display panel and intersecting the first direction; and
a second portion extending from the first portion in the first direction, and
wherein the first portion is bent about an axis parallel to the first direction.

3. The display device of claim 2,
wherein at least a portion of the second portion overlaps the body part.

4. The display device of claim 1,
wherein a first width of the buffer layer is equal to or greater than a second width of the tail part, and
wherein the first width and the second width are measured along a first direction parallel to a shorter side of the display panel.

5. The display device of claim 4,
wherein the buffer layer is made of stainless steel.

6. The display device of claim 1,
wherein the buffer layer is attached to a back of the display panel.

7. The display device of claim 1,
wherein the buffer layer is attached to the tail part.

8. The display device of claim 7,
wherein the buffer layer is attached to the tail part using an adhesive layer,
wherein the adhesive layer is disposed between a portion of the buffer layer and the tail part,
wherein the portion of the buffer layer is attached to the tail part using the adhesive layer, and
wherein the portion of the buffer layer corresponds to two thirds or less of a planar area of the buffer layer.

9. The display device of claim 1, further comprising:
a cover window overlapping the display panel; and
an adhesive layer disposed between the display panel and the cover window.

10. A display device, comprising:
a display panel including a main area including a display area and a touch area, and a sub-area extending from the main area and where a display driver is located,
wherein the main area has a first side extending in a first direction and a second side extending in a second direction, wherein the second side is longer than the first side, and the first direction intersects the second direction;

a flexible printed circuit board connected to the sub-area; and a buffer layer disposed between the main area and the flexible printed circuit board, wherein the flexible printed circuit board comprises:

a body part on which a touch driver is located;

a connection part located along a first edge of the body part and joined to the sub-area; and a tail part extending from a second edge, opposite to the first edge, of the body part and having a thickness thinner than the body part, and wherein the tail part includes a first portion extending from the body part and overlapping the buffer layer, and a second portion extending from the first portion.

11. The display device of claim 10, wherein the first portion includes a bent portion, and wherein the bent portion overlaps the buffer layer.

12. The display device of claim 11, wherein the second portion extends in the first direction, and wherein the first portion extends in the second direction and is bent about an axis parallel to the first direction.

13. The display device of claim 12, wherein at least a portion of the second portion vertically overlaps the body part.

14. The display device of claim 10, wherein a first width of the buffer layer is greater than a second width of the first portion, and wherein the first width and the second width are measured along the first direction.

15. The display device of claim 14, wherein the buffer layer has a thickness of about 0.2 mm or less.

16. The display device of claim 10, wherein the buffer layer is attached to a back of the main area.

17. The display device of claim 10, wherein the buffer layer is attached to the first portion.

18. The display device of claim 17, further comprising:

an adhesive layer disposed between a portion of the buffer layer and the tail part, wherein the buffer layer is attached to the first portion, wherein the portion of the buffer layer is attached to the tail part using the adhesive layer, and wherein the portion of the buffer layer corresponds to two thirds or less of a planar area of the buffer layer.

19. The display device of claim 10, further comprising:

a cover window overlapping the display panel; and an adhesive layer disposed between the display panel and the cover window.

20. An electronic device, comprising:

a display device including:

a display panel including a pad area;

a flexible printed circuit board connected to the display panel; and a buffer layer disposed between the display panel and the flexible printed circuit board, wherein the flexible printed circuit board includes a body part on which components are arranged, a connection part disposed along a first edge of the body part and bonded to the pad area, and a tail part extending from a second edge, opposite to the first edge, of the body part, wherein the tail part vertically overlaps the buffer layer, wherein the tail part includes a bent portion, and wherein the bent portion vertically overlaps the buffer layer.

* * * * *